US008551868B2

(12) United States Patent
Holme et al.

(10) Patent No.: US 8,551,868 B2
(45) Date of Patent: Oct. 8, 2013

(54) IRRADIATION ASSISTED NUCLEATION OF QUANTUM CONFINEMENTS BY ATOMIC LAYER DEPOSITION

(75) Inventors: Timothy P. Holme, Menlo Park, CA (US); Andrei Iancu, Stanford, CA (US); Hee Joon Jung, Palo Alto, CA (US); Michael C Langston, Los Altos Hills, CA (US); Munekazu Motoyama, Kumamoto (JP); Friedrich B. Prinz, Woodside, CA (US); Takane Usui, Palo Alto, CA (US); Hitoshi Iwadate, Palo Alto, CA (US); Neil Dasgupta, San Francisco, CA (US); Cheng-Chieh Chao, Mountain View, CA (US)

(73) Assignees: The Board of Trustees of the Leland Stanford Junior Universit, Palo Alto, CA (US); Honda Patents & Technologies North America, LLC, Raymond, OH (US)

( * ) Notice: Subject to any disclaimer, the term of this patent is extended or adjusted under 35 U.S.C. 154(b) by 0 days.

(21) Appl. No.: 13/065,582

(22) Filed: Mar. 24, 2011

(65) Prior Publication Data
US 2011/0269298 A1 Nov. 3, 2011

Related U.S. Application Data

(60) Provisional application No. 61/340,916, filed on Mar. 24, 2010.

(51) Int. Cl.
*H01L 21/36* (2006.01)
(52) U.S. Cl.
USPC ........... 438/478; 438/487; 257/9; 257/14; 257/E33.008; 257/E29.069; 257/E21.089; 977/755; 977/762; 977/773; 977/774

(58) Field of Classification Search
None
See application file for complete search history.

(56) References Cited

U.S. PATENT DOCUMENTS

| 6,428,859 B1 * | 8/2002 | Chiang et al. ............. 427/457 |
| 2003/0010971 A1 * | 1/2003 | Zhang et al. ............. 257/15 |
| 2010/0099268 A1 | 4/2010 | Timans | |

FOREIGN PATENT DOCUMENTS

| KR | 10-2004-0054442 A | 6/2004 |
| KR | 10-2004-0093978 A | 11/2004 |

OTHER PUBLICATIONS

Cao et al. ("Observation of a Quantum-Confinement Effect with GaN Nanoparticles Synthesized Through a New Gas Reaction Route", Applied Physics A 71, 229-231, 2000).*

(Continued)

*Primary Examiner* — Julio Maldonado
*Assistant Examiner* — Yasser Abdelaziez
(74) *Attorney, Agent, or Firm* — Lumen Patent Firm

(57) ABSTRACT

A method of fabricating quantum confinements is provided. The method includes depositing, using a deposition apparatus, a material layer on a substrate, where the depositing includes irradiating the layer, before a cycle, during a cycle, and/or after a cycle of the deposition to alter nucleation of quantum confinements in the material layer to control a size and/or a shape of the quantum confinements. The quantum confinements can include quantum wells, nanowires, or quantum dots. The irradiation can be in-situ or ex-situ with respect to the deposition apparatus. The irradiation can include irradiation by photons, electrons, or ions. The deposition is can include atomic layer deposition, chemical vapor deposition, MOCVD, molecular beam epitaxy, evaporation, sputtering, or pulsed-laser deposition.

41 Claims, 12 Drawing Sheets

(56) References Cited

OTHER PUBLICATIONS

Facsko et al. ("Formation of Nanoscale Semiconductor Dots by Ion Sputtering", Science, vol. 285, 1551-1553, 1999).*
Tan et al. ("Combining Atomic Layer Deposition with A Template-Assisted Approach to Fabricate Size-reduced Nanowire Arrays on Substrates and Their Electrochemical Characterization", J. Phys. Chem. C, 111, pp. 4964-4968, 2007).*
WIPO: Forms PCT/ISA/210 and PCT/ISA/237 (Search Report and Written Opinion) for International application PCT/US2011/00542, mailed Feb. 8, 2012.

* cited by examiner

IRRADIATION ASSISTED NUCLEATION OF QUANTUM CONFINEMENTS BY ATOMIC LAYER DEPOSITION

CROSS-REFERENCE TO RELATED APPLICATIONS

This application claims priority from U.S. Provisional Patent Application 61/340,916 filed Mar. 24, 2010, which is incorporated herein by reference.

STATEMENT OF GOVERNMENT SPONSORED SUPPORT

This invention was made with Government support under contract W911NF-07-2-0027 awarded by Department of Defense (DoD)—U.S. Army Research Laboratory. The Government has certain rights in this invention.

FIELD OF THE INVENTION

The invention relates to methods of fabricating quantum confinement structures, such as quantum dots, wires, tubes or wells. In particular, the invention relates to methods of using irradiation to influence atomic layer deposition (ALD) nucleation behavior or methods of modifying ALD nucleation behavior to affect quantum confinement properties of deposited ALD films.

BACKGROUND OF THE INVENTION

Quantum confinement structures, such as quantum dots, tubes, wires and wells, posses several advantageous characteristics for use in a variety of devices. The bandgap, reactivity and Fermi level, of a quantum-confined material can be adjusted by controlling the size of the confinement dimensions. This has profound impacts on the chemical, electronic and optical properties of the materials, allowing for fabrication of several novel architectures including solar cells, catalysts, batteries, lasers and photodetectors.

What is needed is a method of fabricating quantum confinements, where the dimensions and surrounding material is controlled to produce a desired bandgap of the of quantum confinement structures.

SUMMARY OF THE INVENTION

To address the needs in the art, a method of fabricating quantum confinements is provided. According to one embodiment, the method includes depositing, using a deposition apparatus, a material layer on a substrate, where the depositing includes irradiating the layer, before a cycle, during a cycle, and/or after a cycle of the deposition to alter nucleation of quantum confinements in the material layer to control a size and/or a shape of the quantum confinements.

In one aspect of the invention, the quantum confinements can include quantum wells, nanowires, nanotubes or quantum dots.

In another aspect of the invention the substrate includes 3-D topologies having aspect ratios in a range from 1 to 5000.

In a further aspect of the invention, the irradiation is in-situ or ex-situ with respect to the deposition apparatus.

According to another aspect of the invention, the irradiation can include irradiation by photons, electrons, or ions.

In yet another aspect of the invention, use of the irradiation is further disposed to affect a morphology, a nucleation density, and/or a chemistry of the material layer.

According to one aspect of the invention, a bandgap of the material layer is adjusted by controlling the size of the quantum confinement dimensions.

In a further aspect of the invention, a bandgap of the material layer is adjusted by controlling the material properties surrounding the quantum confinements.

In one aspect of the invention, template-assisted growth is used to form the quantum confinements. Here the template-assisted growth can include using anodized aluminum oxide (AAO), or track-etched polycarbonate membranes, where the quantum confinements can include quantum dots, nanowires or nanotubes.

According to another aspect of the invention, the deposition can include atomic layer deposition, chemical vapor deposition, MOCVD, molecular beam epitaxy, evaporation, sputtering, or pulsed-laser deposition. In this aspect, the quantum confinements can include quantum dots, where a nucleation of the quantum dots is controlled by controlling ALD deposition conditions that can include precursors, reactor temperatures, substrate materials, reactor pressures, ambient gases, precursor pulse time or reaction time.

In one aspect of the invention, chemical reactions on the surface of the material layer are induced using ambient gases and the irradiation, where the ambient gas includes an oxidizing or reducing species, where when the species is exposed to the irradiation catalyzed chemical reactions are formed on the surface of the material layer, where nucleation of the quantum confinements are affected by breaking chemical bonds, forming the chemical bonds, or influencing the stoichiometry of the material layer.

According to a further aspect of the invention, the irradiation is disposed to transfer kinetic energy from the irradiation to the material layer, where an increase in surface temperature of the material layer is provided, and where the increase in surface temperature of the material layer controls properties of the material layer that can include surface diffusion, sublimation, evaporation, coalescence, or Ostwald ripening.

In one aspect of the invention, the irradiation is disposed to cause chemical changes in the material layer that includes a breaking of chemical bonds, where a formation of new morphologies on the surface of the material layer is provided.

In a further aspect of the invention, the irradiation is disposed to create static electric charges on a surface of the material layer.

According to another aspect of the invention, the irradiation is disposed to roughen the surface morphology of the material layer, where the rough surface morphology controls a nucleation behavior of the quantum confinements by creating preferential sites for nucleation and controlling surface diffusion processes.

In yet another aspect of the invention, the irradiation includes a photon source that includes a lamp or a laser.

According to another aspect of the invention, the irradiation is disposed to increase a surface temperature of the material layer, where the increased surface temperature of the material layer breaks chemical bonds on the surface of the material layer to enhance diffusion in the material layer or in the substrate, where a formation of quantum wells, nanowires or dots by ALD are controlled.

In one aspect of the invention, the irradiation includes an electron source that can include a field-emission gun and a thermionic source.

In a further aspect of the invention, the irradiation includes ion irradiation that is used to transfer kinetic energy to the material layer or the substrate, where the ion irradiation is used to modify the morphology of the substrate, create static charges on the material layer surface, where the nucleation size and density of the quantum confinements are controlled.

In yet another aspect of the invention, the irradiation includes ion irradiation used control electrostatic interactions between material being deposited and the material layer or the substrate, where the interactions modify the morphology of the substrate or create static charges on the material layer surface, where the nucleation size and density of the quantum confinements, are controlled.

In one aspect of the invention, the irradiation is patterned by controlling the irradiation source and irradiation direction of an incoming irradiation species, where the pattern controls the growth of the quantum confinements.

According to a further aspect of the invention, the irradiated layer is masked in a pattern, where growth of the quantum confinements is controlled according to the mask pattern.

In another embodiment, the invention includes a method of fabricating quantum confinements that includes irradiating a substrate, using an ion irradiation source, where the ion irradiation alters the substrate surface, using a deposition apparatus to deposit a material layer on the altered substrate surface, where the altered substrate surface promotes nucleation of quantum confinements within the material layer.

In one aspect of the current embodiment, the quantum confinements can include quantum wells, nanowires, nanotubes or quantum dots.

According to a further aspect of the current embodiment, the substrate includes 3-D topologies having aspect ratios in a range from 1 to 5000.

In yet another aspect of the current embodiment, the irradiation is in-situ or ex-situ with respect to the deposition apparatus.

In one aspect of the current embodiment, use of the irradiation is further disposed to affect a morphology, a nucleation density, and/or a chemistry of the material layer.

According to another aspect of the current embodiment, a bandgap of the material layer is adjusted by controlling the size of the quantum confinement dimensions.

In one aspect of the current embodiment, a bandgap of the material layer is adjusted by controlling the material properties surrounding the quantum confinements.

In yet another aspect of the current embodiment, template-assisted growth is used to form the quantum confinements. In this aspect, the template-assisted growth can include using anodized aluminum oxide (AAO), or track-etched polycarbonate membranes, where the quantum confinements include quantum dots, nanowires or nanotubes.

In a further aspect of the current embodiment, the deposition can include use of atomic layer deposition, chemical vapor deposition, MOCVD, molecular beam epitaxy, evaporation, sputtering, or pulsed-laser deposition.

In one aspect of the current embodiment, the quantum confinements comprise quantum dots, where a nucleation of the quantum dots are controlled by controlling ALD deposition conditions include precursors, reactor temperatures, substrate materials, reactor pressures, ambient gases, precursor pulse time or reaction time.

According to another aspect of the current embodiment, where chemical reactions on the surface of the material layer are induced using ambient gases and the irradiation, where the ambient gas includes an oxidizing or reducing species, where when the oxidizing or reducing species is exposed to the irradiated surface to promote chemical reactions on the surface of the substrate layer, and where nucleation of the quantum confinements are affected by breaking chemical bonds by the irradiation, forming the chemical bonds by the irradiation, or influencing the stoichiometry of the material layer by the irradiation.

In yet another aspect of the current embodiment, the irradiation is disposed to cause chemical changes in the substrate layer that includes a breaking of chemical bonds, where a formation of new morphologies on the surface of the material layer is provided.

In one aspect of the current embodiment, the irradiation is disposed to create static electric charges on a surface of the substrate layer.

According to further aspect of the current embodiment, the irradiation is disposed to roughen the surface morphology of the substrate layer, where the rough surface morphology controls a nucleation behavior of the quantum confinements by creating preferential sites for nucleation and controlling surface diffusion processes.

In another aspect of the current embodiment, the ion irradiation is used to transfer kinetic energy to the substrate, where the ion irradiation is used to modify the morphology of the substrate, create static charges on the material layer surface, where the nucleation size and density of the quantum confinements in the material layer are controlled.

In yet another aspect of the current embodiment, the ion irradiation is used to control electrostatic interactions between material being deposited and the substrate, where the interactions modify the morphology of the substrate or create static charges on the material layer surface, where the nucleation size and density of the quantum confinements are controlled.

BRIEF DESCRIPTION OF THE DRAWINGS

FIGS. 9.b1-9.b5 show a series of snapshots taken during an in situ HRTEM video of crystal orientation synchronized with a bridge of aligned (200) planes between the particles, according to one embodiment of the invention.

DETAILED DESCRIPTION

Figure 1:
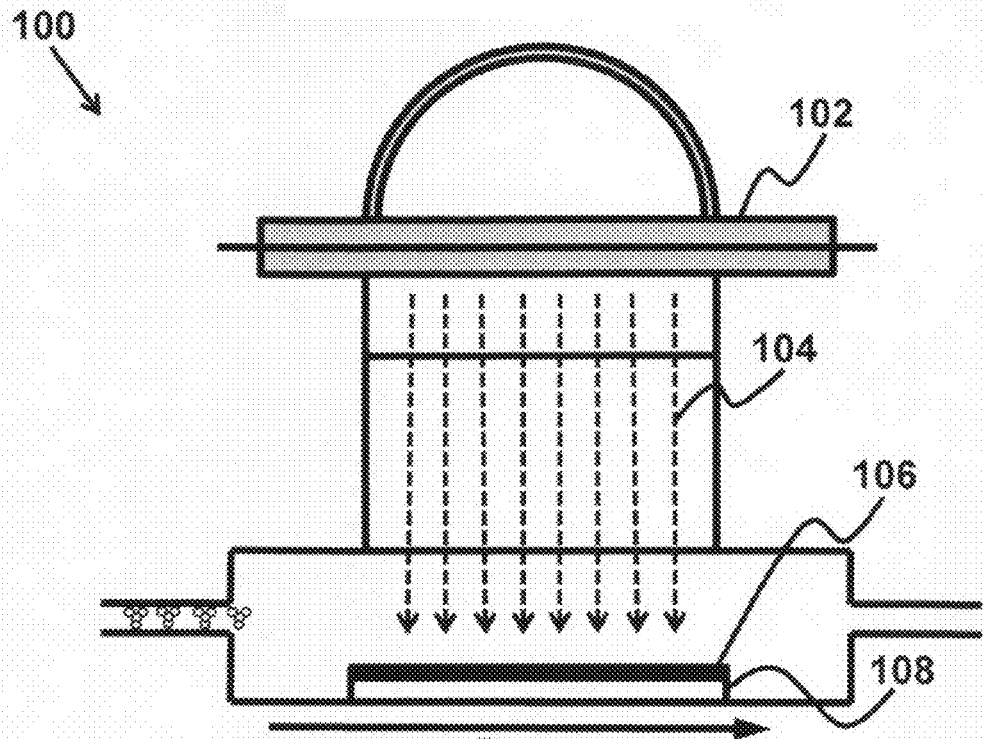
FIGS. 1a-1e show schematic drawings of a deposition apparatus having an irradiation source irradiating a layer, before a cycle, during a cycle, and/or after a cycle of the deposition, according to one embodiment of the invention.
Figure 1:
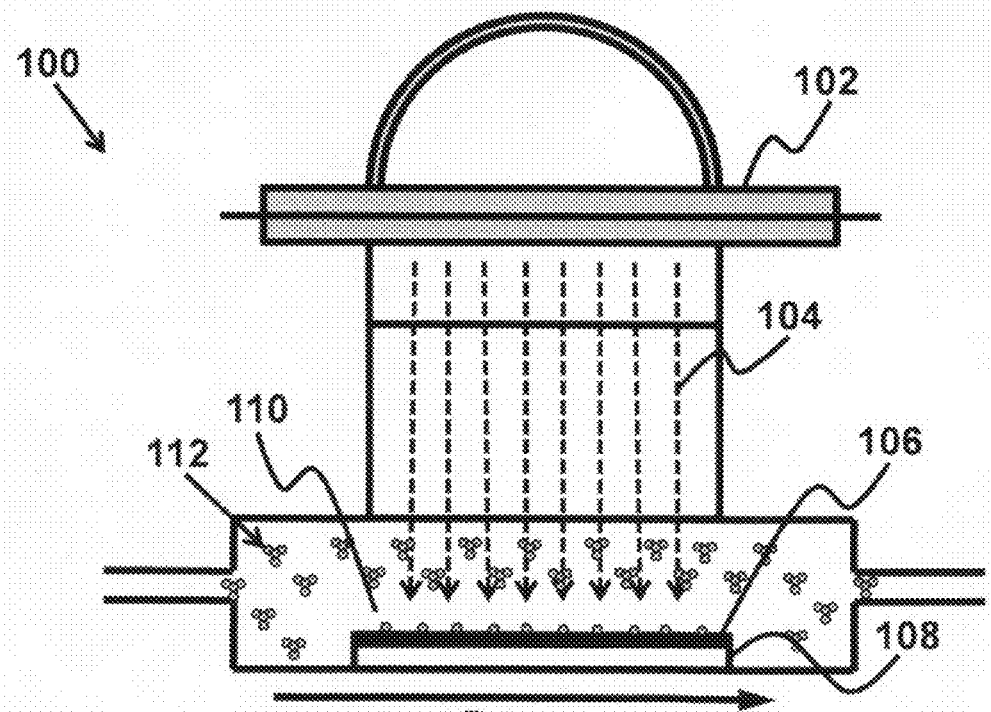
Figure 1:
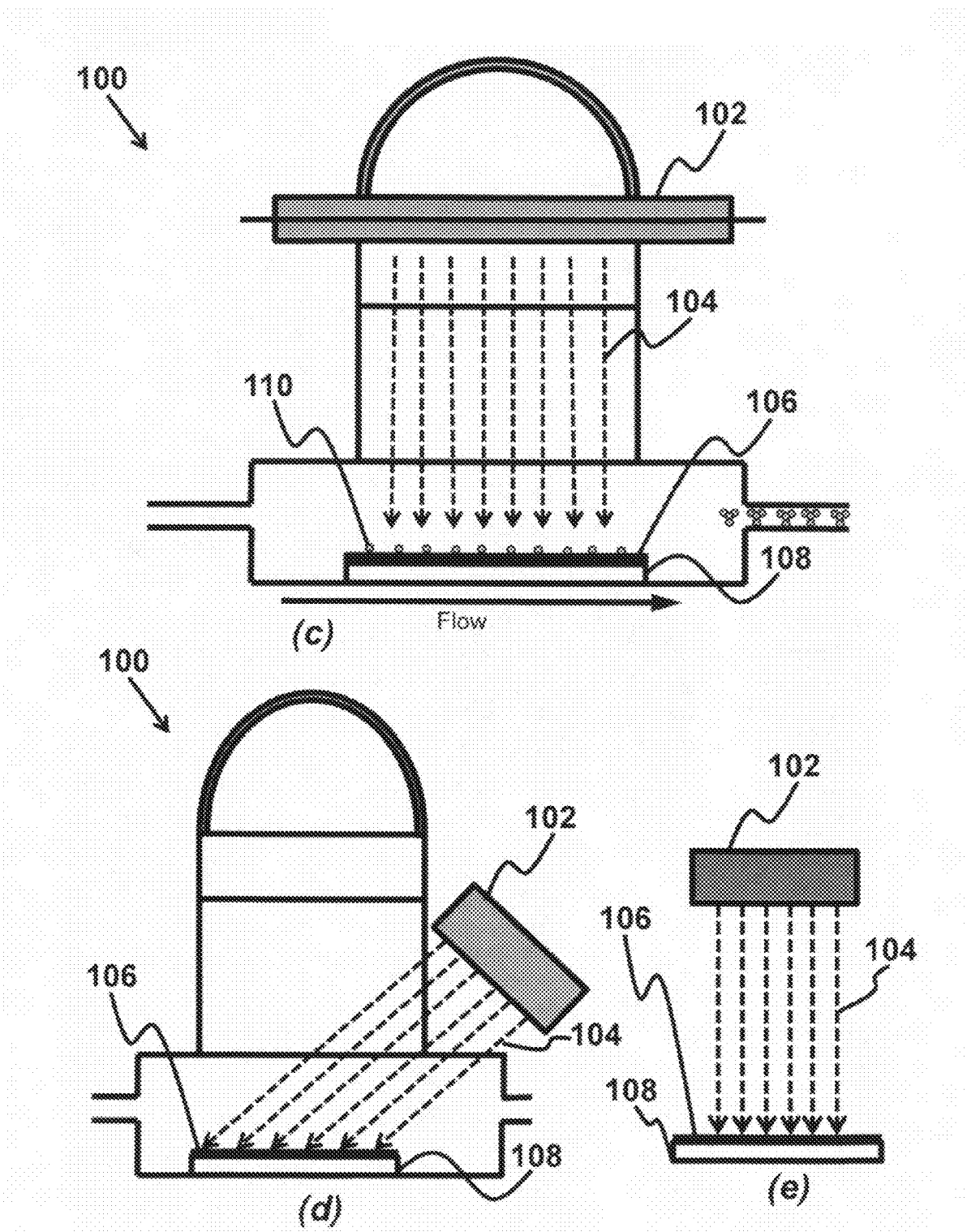

The current invention includes use of Atomic Layer Deposition (ALD), in which materials are deposited in two half-cycle reactions that are based on self-limiting surface chemistry. Due to the self-limiting nature of these reactions, materials can be deposited with sub-nm precision in thickness, with no pinholes, and over complex 3-D topologies with high aspect ratios. Those skilled in the art may appreciate that irradiation techniques described in the following paragraphs may be used to alter the film properties of films deposited with other thin-film deposition techniques such as but not limited to sputtering, pulsed-laser deposition, evaporation, chemical vapor deposition, MOCVD, MBE, etc.

In one aspect, ALD is used for fabrication of quantum confinement structures in several ways. Deposition of thin films of semiconductor materials with thicknesses in the quantum confinement regime is achieved through ALD deposition on a variety of substrates. For fabrication of nanowires, template-assisted growth is used by taking advantage of the ability of ALD to coat high-aspect ratio structures, such as aspect ratios from 1 to 5000. For example, using anodized aluminum oxide (AAO) or track-etched polycarbonate membranes as a template for ALD, growth results in the formation of nanowires or nanotubes with dimensions which can act as 1-D or 2-D quantum confinements.

Furthermore, quantum dots can be formed using ALD by taking advantage of the nucleation behavior of films after very few deposition cycles. Certain ALD reactions form films by nucleation and growth of islands on a substrate during the initial ALD cycles, until a complete film is created. This nucleation behavior depends on the precursors used, reactor temperatures, substrate materials, reactor pressures, ambient gases, precursor pulse time or reaction time. By the appropriate selection of deposition conditions, nucleation of quantum-sized particles is possible by ALD.

This invention includes various techniques in which the nucleation behavior of ALD films can be influenced by irradiation of the film and/or substrate. The irradiation can include photons, electrons or ions. The irradiation influences the nucleation behavior in several ways. Transfer of kinetic energy from the incoming irradiation causes the surface temperature to rise, allowing for various processes to occur including surface diffusion, sublimation, evaporation, coalescence, or Ostwald ripening of the material. The irradiation also causes chemical changes including breaking of chemical bonds, allowing for formation of new morphologies on the surface. Additionally, the irradiation can influence the surface by creating static electric charges or a rougher surface morphology. This influences the nucleation behavior by creating preferential sites for nucleation, as well as influencing surface diffusion processes.

According to the invention, irradiation is combined with ALD in a variety of manners. In one embodiment, photon irradiation is provided in-situ during deposition, by including a photon source in the deposition chamber. This photon source could be a lamp, laser or other optical device. Irradiation from the photon source can be performed before, during and/or after each deposition cycle to influence the nucleation behavior. This can cause an increase in surface temperature, breaking of chemical bonds on the surface and formation of excited electronic states in the film or substrate. This in turn can influence the formation of quantum wells, nanowires, nanotubes or quantum dots by ALD. Photon irradiation can also be performed ex-situ, in a separate irradiation system.

In another embodiment, electron irradiation is used to influence the ALD nucleation behavior. An electron source such as a field-emission gun or thermionic source can be used to inject electrons onto the ALD reaction surface. This can be done in-situ by combining an electron source with an ALD chamber, or ex-situ by pre-treatment or post-treatment of the surface with electron irradiation. Electrons can also transfer kinetic energy to the surface, causing similar effects on the physical and chemical properties of the film and substrate. Additionally, since electrons are charged particles, they can interact with electrical charges in the film and substrate by creating static charges or modifying the distribution of electrical charges on the surface. This can assist in breaking of chemical bonds, altering surface diffusion, and create preferential nucleation sites.

Further, ion irradiation can be used to impact the nucleation behavior of the ALD films. Again, the ion irradiation source can be used before, during and/or after the ALD process. Ion irradiation, can act in a similar way to electron irradiation, by transferring kinetic energy to the film or substrate. It can also modify the morphology of the substrate, and create static charges on the surface, which can affect the nucleation size and density. Ions are significantly more massive than electrons; therefore, they interact differently with the surface, and create a different distribution of static charges and defects. Irradiation with a species that is incorporated in the film may cause local charge imbalances, as in the case of substitutional doping. For example, irradiation of a $ZrO_2$ substrate with $Y^+$ ions may form $Y_{Zr}{}^!$ defects that associate with oxygen vacancies $O_v$. Either charged defect may interact with the depositing species during deposition cycles to attract or repel the depositing species and thereby alter the nucleation and growth properties of the film.

The irradiation behavior is highly dependent on a variety of variables such as kinetic energy, dose and particle type. Additionally, the impact of irradiation on the ALD nucleation behavior depends on environmental variables during the deposition and irradiation process. These include chamber pressure, temperature, substrate material, and ambient gases present. The use of ambient gases in conjunction with irradiation cause chemical reactions to occur on the surface. For example, use of an oxidizing or reducing species such as hydrogen or oxygen in combination with irradiation catalyze chemical reactions on the surface. This in turn affects nucleation by breaking or forming chemical bonds, and influencing the stoichiometry of the deposited material.

Turning now to the figures, FIGS. 1a-1c show schematic drawings of a deposition apparatus 100 having an irradiation source 102 that is in-situ and disposed for irradiating 104 a layer 106, before a cycle (FIG. 1a), during a cycle (FIG. 1b), and/or after a cycle (FIG. 1c) of the deposition, according to one embodiment of the invention. The material layer 106 is disposed on a substrate 108, where the deposition alters nucleation of quantum confinements 110 in the material layer 106 to control a size and/or a shape of the quantum confinements 110. According to various embodiments of the invention, the irradiation source 102 can be in-situ or ex-situ with respect to the deposition apparatus 100, where FIGS. 1a-1c show an in-situ irradiation source 102, and FIGS. 1d-1e show an ex-situ irradiation source 102. The deposition apparatus may be made to deposit layers via thin-film deposition techniques including atomic layer deposition, chemical vapor deposition, MOCVD, molecular beam epitaxy, evaporation, sputtering, or pulsed-laser deposition. In one aspect, the quantum confinements 110 can include quantum dots, where a nucleation of the quantum dots is controlled by controlling ALD deposition conditions that can include precursors, reactor temperatures, substrate materials, reactor pressures, ambient gases, precursor pulse time or reaction time. The method further includes inducing chemical reactions on the surface of the material layer 106 using reactive gases 112 and the irradiation 104, where the ambient gas includes an oxidizing or reducing species. Here, when the species is exposed to the irradiation 104, catalyzed chemical reactions are formed on the surface of the material layer 106, where nucleation of the quantum confinements 110 are affected by breaking chemical bonds, forming the chemical bonds, or influencing the stoichiometry of the material layer 106.

According to one embodiment of the invention, the irradiation 104 is disposed to transfer kinetic energy from the irradiation 104 to the material layer 106, where an increase in surface temperature of the material layer 106 is provided, and where the increase in surface temperature of the material layer 106 controls properties of the material layer 106 that can include surface diffusion, sublimation, evaporation, coalescence, or Ostwald ripening.

Figure 2:
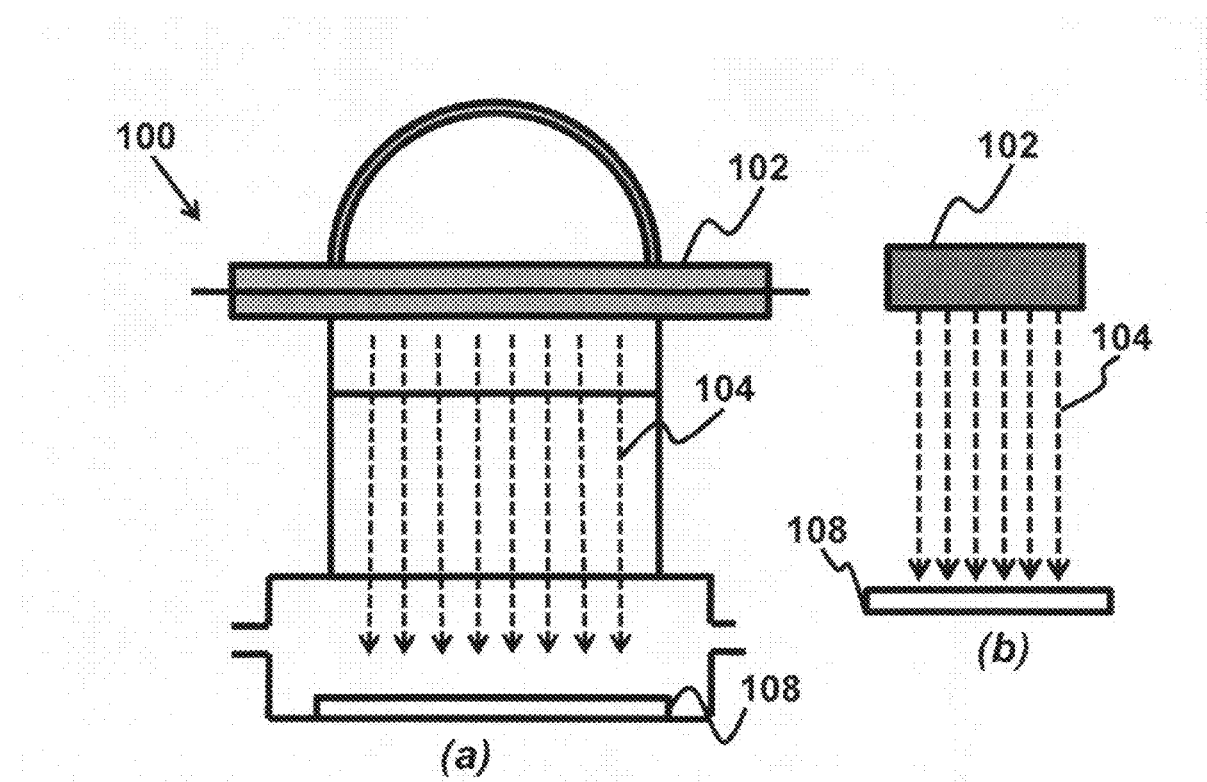
FIGS. 2a-2b show schematic drawings of a deposition apparatus having an irradiation source disposed for irradiating a substrate before the deposition, according to one embodiment of the invention.

FIGS. 2a-2b shows a schematic drawing of a deposition apparatus 100 having an irradiation source 102 irradiating 104 a substrate 108 before the deposition of a layer, according to one embodiment of the invention.

Figure 3:
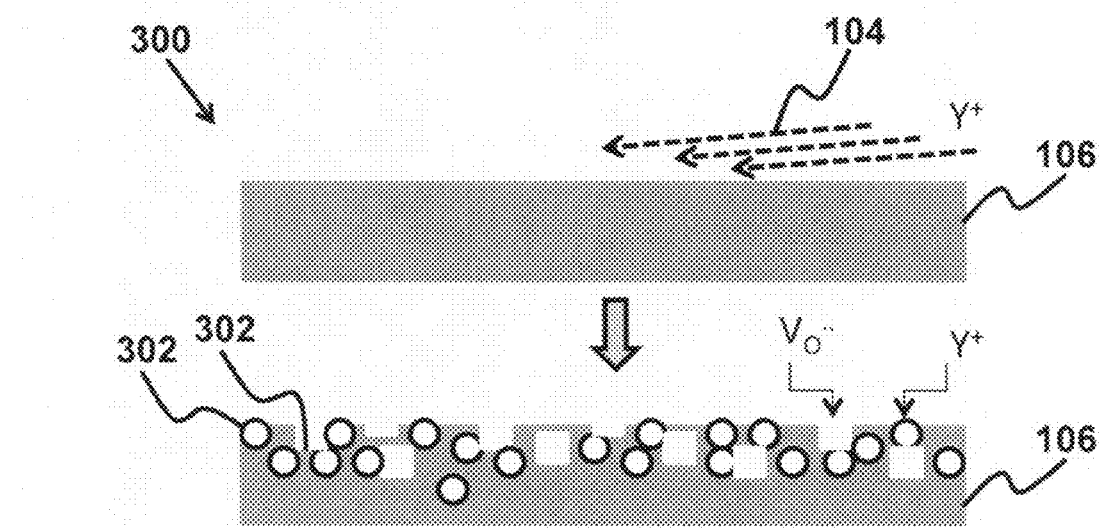
FIG. 3 shows a schematic drawing of irradiation disposed to roughen the surface morphology of the material layer, according to one embodiment of the invention.

FIG. 3 shows a schematic drawing of controlling the surface morphology 300 of the material layer 108, according to one embodiment of the invention. As shown, the irradiation 104 is disposed to roughen the surface morpholo 302 of the material layer 106, or alter the defect chemistry of the material layer 106. Shown are low energy, high angle Yttrium ions 304 irradiating the material layer 106, for example $Y^{3+}$ irradiation of $ZrO_2$, takes the form $Y_{(s)}+ZrO_2 \rightarrow Y_{Zr}'+½Vo$. Here, the aliovalent dopant Y causes charge imbalances that interact with ALD ligands to control the nucleation density by controlling irradiation dose 104. The charge imbalances may also strongly influence nucleation of films deposited with techniques that use ions, such as sputtering.

In one aspect of the invention, the irradiation 104 is disposed to cause chemical changes in the material layer 106 that include a breaking of chemical bonds, where a formation of new morphologies 300 on the surface of the material layer 106 is provided. The rough surface morphology controls a nucleation behavior of the quantum confinements 110 by creating preferential sites for nucleation and controlling surface diffusion processes.

In a further aspect of the invention, the irradiation 104 is disposed to create static electric charges on a surface of the material layer 106. In one embodiment, the irradiation 104 is ion irradiation 104 that is used to transfer kinetic energy to the material layer 106 or the substrate 108, where the ion irradiation 104 is used to modify the morphology of the substrate 108 and/or create static charges on the surface material layer 106, where the nucleation size and density of the quantum confinements 110 are controlled.

Figure 4:
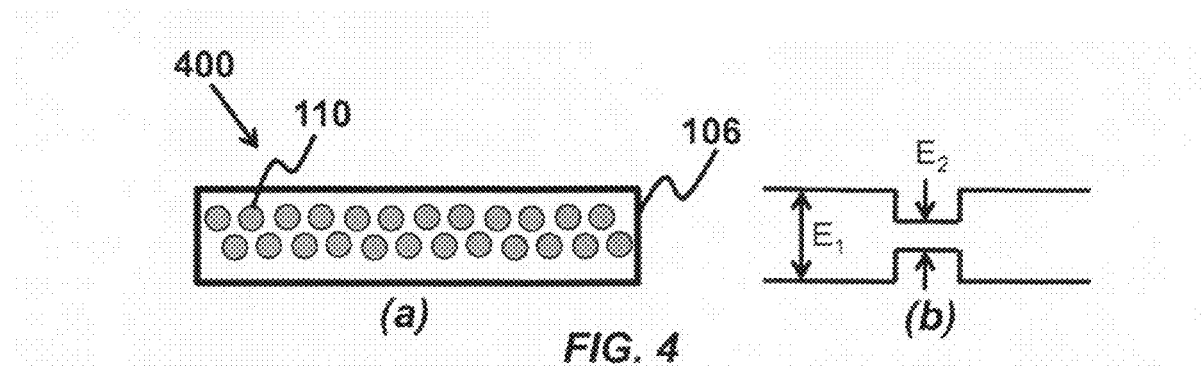
FIGS. 4a-4b show schematic drawings of the bandgap of the material layer that is adjusted by controlling the material properties surrounding the quantum confinements, according to one embodiment of the invention.

FIG. 4 shows a schematic drawing of the material surrounding the quantum confinements 400. Here, a bandgap of the material layer 106 is adjusted by controlling the material properties surrounding the quantum confinements 110, according to one embodiment of the invention. According to one aspect of the invention, the bandgap of the material layer 106 is adjusted by controlling the size of the quantum confinement 110 dimensions.

Figure 5:
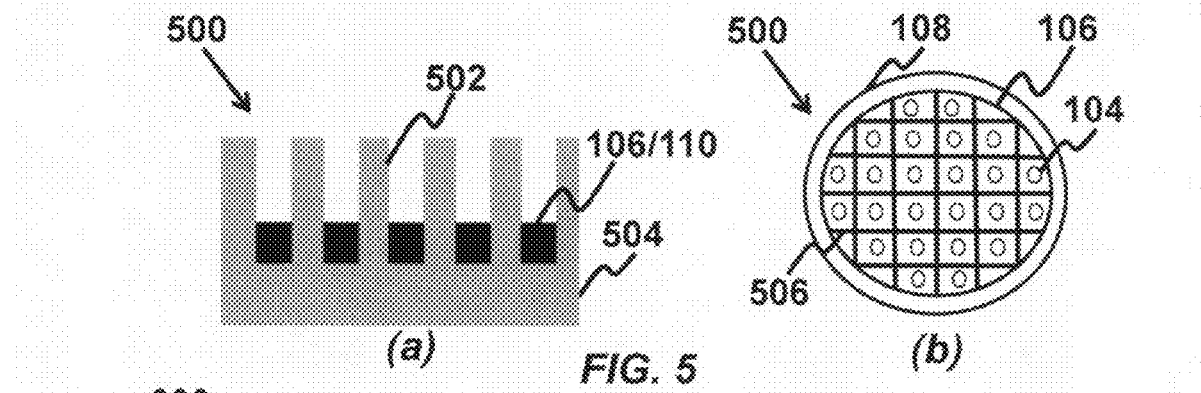
FIGS. 5a-5b show schematic drawings of template-assisted and masked growth that is used to form quantum confinements, according to one embodiment of the invention.

FIGS. 5a-5b show schematic drawings of template-assisted and patterned growth 500 that is used to form quantum confinements 110, according to one embodiment of the invention. In FIG. 5a, the material layer 106 having quantum confinements 110 disposed therewith are formed using template assisted growth. The template-assisted growth can include using anodized aluminum oxide (AAO), or track-etched polycarbonate membranes. Further shown in FIG. 5a are the anodized or track-etched features 502 in the aluminum oxide or polycarbonate membranes 504. FIG. 5b shows a top view of the irradiation source 104, where the irradiation may be patterned 104 by controlling the irradiation source 104 and direction of incoming irradiation species, or by masking 506 the irradiated layer 106. These patterns are used to control how quantum confinement species grow.

Figure 6:
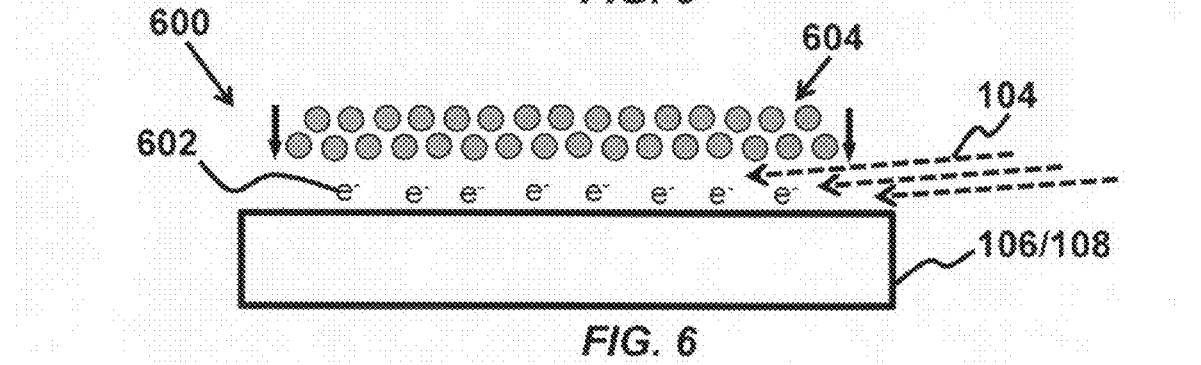
FIG. 6 shows a schematic drawing of ion irradiation used control electrostatic interactions, according to one embodiment of the invention.
Figure 7:
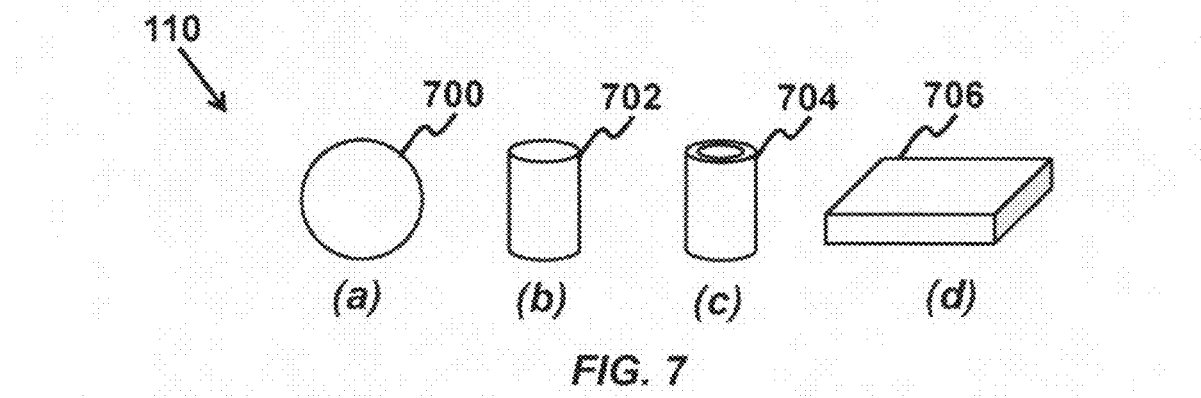
FIGS. 7a-7d show schematic drawings of some quantum confinements, according to the current invention.

FIG. 6 shows a schematic drawing of ion irradiation used control electrostatic interactions 600. As shown, electrostatic interactions 602 are controlled by ion irradiation 104 between material being deposited 604 and the material layer 106 or the substrate 108, where the interactions modify the morphology of the substrate 108 or create static charges on the material layer surface 106, and where the nucleation size and density of the quantum confinements are controlled.

FIGS. 7a-d, show schematic drawings of some of the quantum confinements 110, according to the current invention. The quantum confinements 110 can include quantum dots 600, nanowires 602, nanotubes 604, and quantum wells 606.

In one alternate embodiment of the invention, the method of fabricating quantum confinements includes irradiating a substrate (see FIG. 2), using an ion irradiation source 104, where the ion irradiation alters the substrate surface (see FIG. 3), and depositing, using a deposition apparatus, a material layer 106 (see FIGS. 1a-1d) on the altered substrate surface 108, where the altered substrate surface 108 promotes nucleation of quantum confinements 110 within the material layer 106. Here, the quantum confinements 110 can include quantum wells, nanowires, nanotubes, or quantum dots (see FIG. 7a-7d). According to one aspect of the alternate embodiment, the substrate 108 can include 3-D topologies having aspect ratios in a range from 1 to 5000. In another aspect of the alternate embodiment, the irradiation 104 is in-situ or ex-situ with respect to the deposition apparatus (see FIGS. 1a-1d and FIG. 2). Similar to the description above, the use of the irradiation 104 is further disposed to affect a morphology, a nucleation density, and/or a chemistry of the material layer 106 deposited on the altered substrate 108. Here, the bandgap of the material layer 106 can be adjusted by controlling the size of the quantum confinement 110 dimensions, and further, the bandgap of the material layer 106 is adjusted by controlling the material properties surrounding the quantum confinements 110 (see FIG. 4).

In yet another aspect of the alternate embodiment, template-assisted growth (see FIG. 5) is used to form the quantum confinements 110 on the altered substrate 108. In this aspect, the template-assisted growth 500 can include using anodized aluminum oxide (AAO), or track-etched polycarbonate membranes, where the quantum confinements 110 include quantum dots, nanowires or nanotubes.

In a further aspect of the alternate embodiment, the deposition on the altered substrate 108 can include use of atomic layer deposition, chemical vapor deposition, MOCVD, molecular beam epitaxy, evaporation, sputtering, or pulsed-laser deposition.

In one aspect of the alternate embodiment, the quantum confinements 110 include quantum dots, where a nucleation of the quantum dots are controlled by controlling ALD deposition conditions include precursors, reactor temperatures, substrate materials, reactor pressures, ambient gases, precursor pulse time or reaction time.

According to another aspect of the alternate embodiment, chemical reactions on the surface of the material layer 106 deposited on the altered substrate 108 are induced using ambient gases 112 and the irradiation 104, where the ambient gas 112 includes an oxidizing or reducing species, where when the oxidizing or reducing species is exposed to the irradiated surface to promote chemical reactions on the surface of the altered substrate layer 108, and where nucleation of the quantum confinements 110 are affected by breaking chemical bonds by the irradiation, forming the chemical bonds by the irradiation 104, or influencing the stoichiometry of the material layer 106 by the irradiation 110.

In yet another aspect of the alternate embodiment, the irradiation 104 is disposed to cause chemical changes in the altered substrate layer that includes a breaking of chemical bonds, where a formation of new morphologies on the surface of the material layer 106 is provided.

In one aspect of the alternate embodiment, the irradiation 104 is disposed to create static electric charges on a surface of the altered substrate layer 108.

According to further aspect of the alternate embodiment, the irradiation 104 is disposed to roughen the surface morphology of the substrate layer 108, where the rough surface morphology controls a nucleation behavior of the quantum confinements 110 by creating preferential sites for nucleation and controlling surface diffusion processes.

In another aspect of the alternate embodiment, the ion irradiation 104 is used to transfer kinetic energy to the substrate 104 to modify the morphology of the substrate 104, create static charges (see FIG. 6) on the material layer surface 106 deposited on the altered substrate 108, where the nucleation size and density of the quantum confinements 110 in the material layer 106 are controlled. Further, the ion irradiation 104 can be used to control electrostatic interactions between material being deposited 704 and the altered substrate 108, where the interactions modify the morphology of the substrate or create static charges on the material layer surface, where the nucleation size and density of the quantum confinements 110 are controlled.

Applications of the current invention include using quantum confinements created by this method to influence performance and efficiency of solar cells, catalysts, batteries, lasers and other optoelectronic devices. Here, precise control of feature size with sub-nm precision is enabled. Further, the invention provides the ability to create complex 3-D architectures with quantum confinements as part of the device. Large scale manufacturing of quantum confinements with a small amount of material used. The invention further provides the ability to control optical and electrical properties of ALD films.

An exemplary process of fabricating quantum confinements, such as quantum dots (QD), is presented, according to one embodiment of the invention, where ALD provides several advantages over standard QD fabrication methods. Here, it is understood that, in this discussion, QD applies to the confinements discussed above, including quantum dots, nanowires, nanotubes and quantum wells. While colloidal growth allows for low cost, high-throughput fabrication of QDs with a small size variance, deposition of multiple layers can become costly and time-consuming. A further drawback to a colloidal approach is that the formation of dots requires the presence of surface ligands to prevent agglomeration. These ligands are often insulating, hindering charge extraction from the QDs. They also define the quantum confinement barrier, limiting the ability to engineer the bandgap by controlling energy barrier height. In contrast, strained epitaxial growth techniques enable the in situ vapor phase deposition of both the dot material and the barrier materials, allowing one to engineer the QD energy levels not only by confinement size, but also by choosing the barrier energy height and carrier effective masses. However, the material systems suitable for this growth mode are limited due to the strict requirements on lattice parameter mismatch and crystal structure of both materials. Additionally, epitaxial growth modes, such as molecular beam epitaxy (MBE) and metal-organic chemical vapor deposition (MOCVD) are high-temperature or high vacuum processes, which adds to the cost of these techniques.

ALD provides an alternate technique for fabrication of quantum confinement structures. ALD is a modified version of MOCVD in which the chemical reaction is broken into two half-cycles, which saturate the surface due to the self-limiting chemistry of the precursor molecules. This allows for subnanometer precision in film thickness that is controlled by the number of ALD cycles rather than temperature or time. Here the substrate-inhibited growth mode observed in the initial cycles of certain ALD chemistries is exploited, leading to nucleation and growth of islands rather than formation of a dense film. This suggests a route to directly deposit QDs that are not capped by organic groups or restricted by epitaxial requirements. The quantum mechanical barrier can be easily defined by choice of a capping layer deposited by ALD. Additionally, formation of high-aspect ratio coatings is possible with ALD, allowing for uniform coverage of 3D nanostructured architectures.

Figure 8:
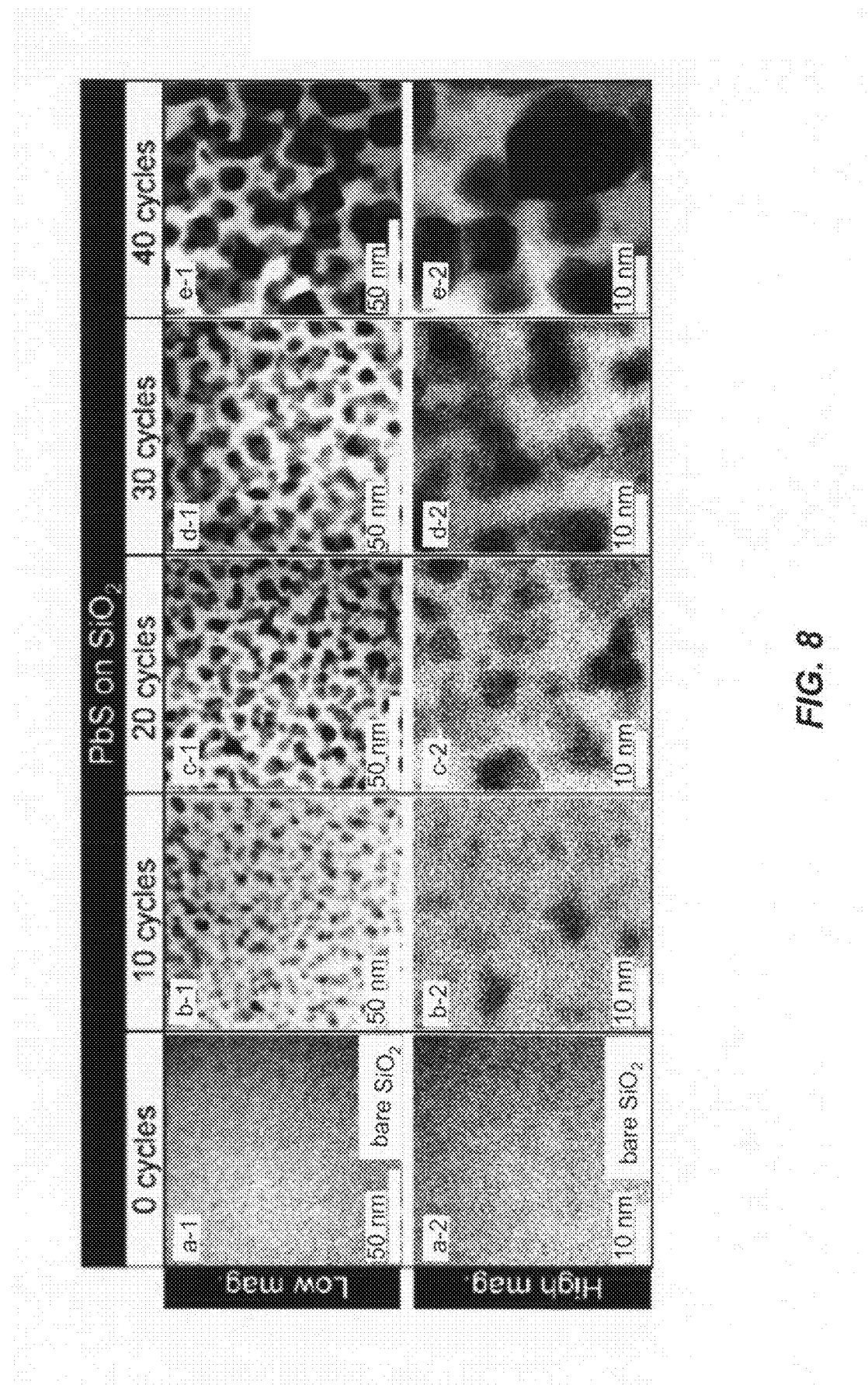
FIGS. 8.a1-8.h show plane-view images of nucleation growth taken of films after 10 to 80 ALD cycles, according to one embodiment of the invention.
Figure 8:
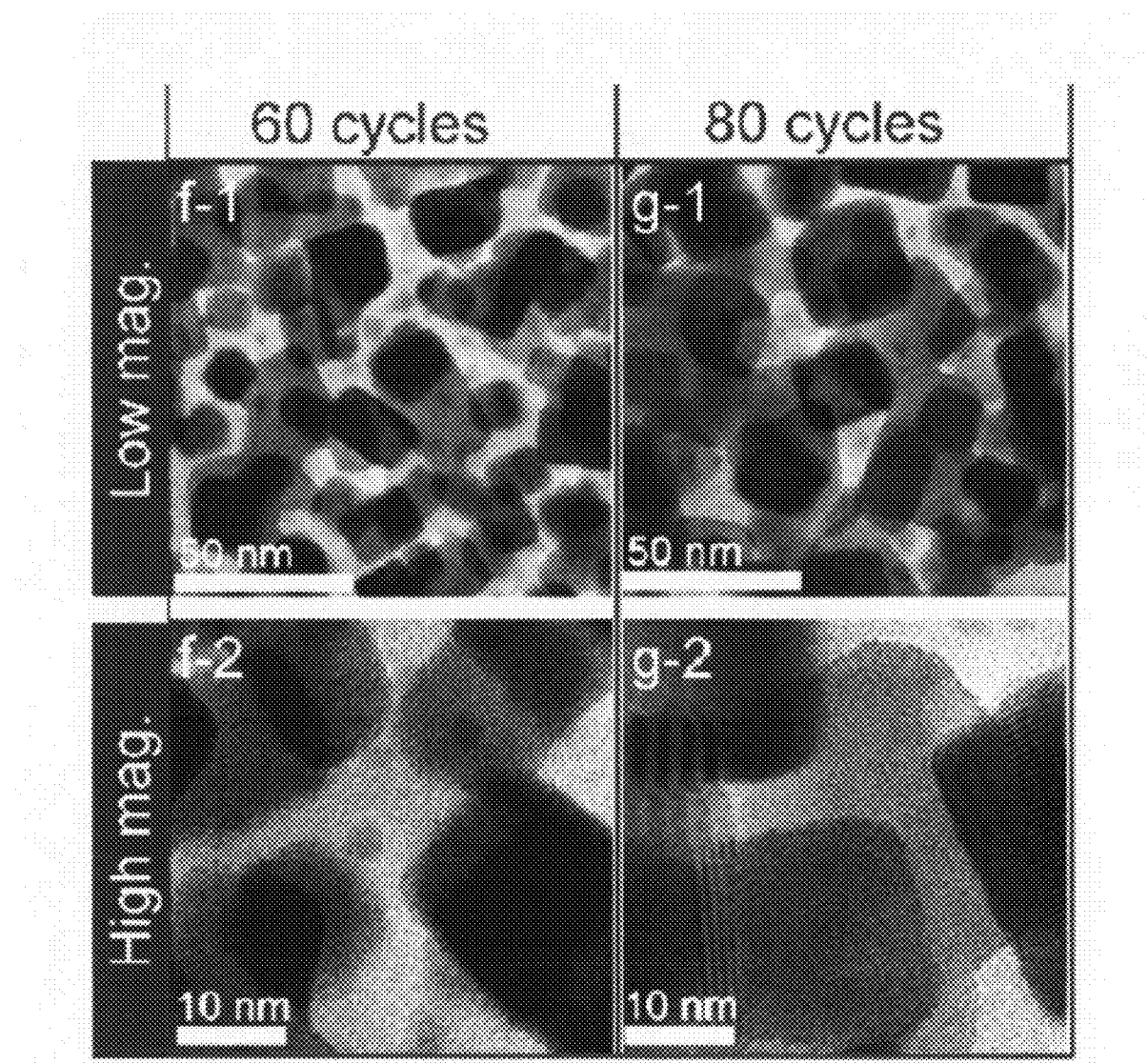
Figure 8:
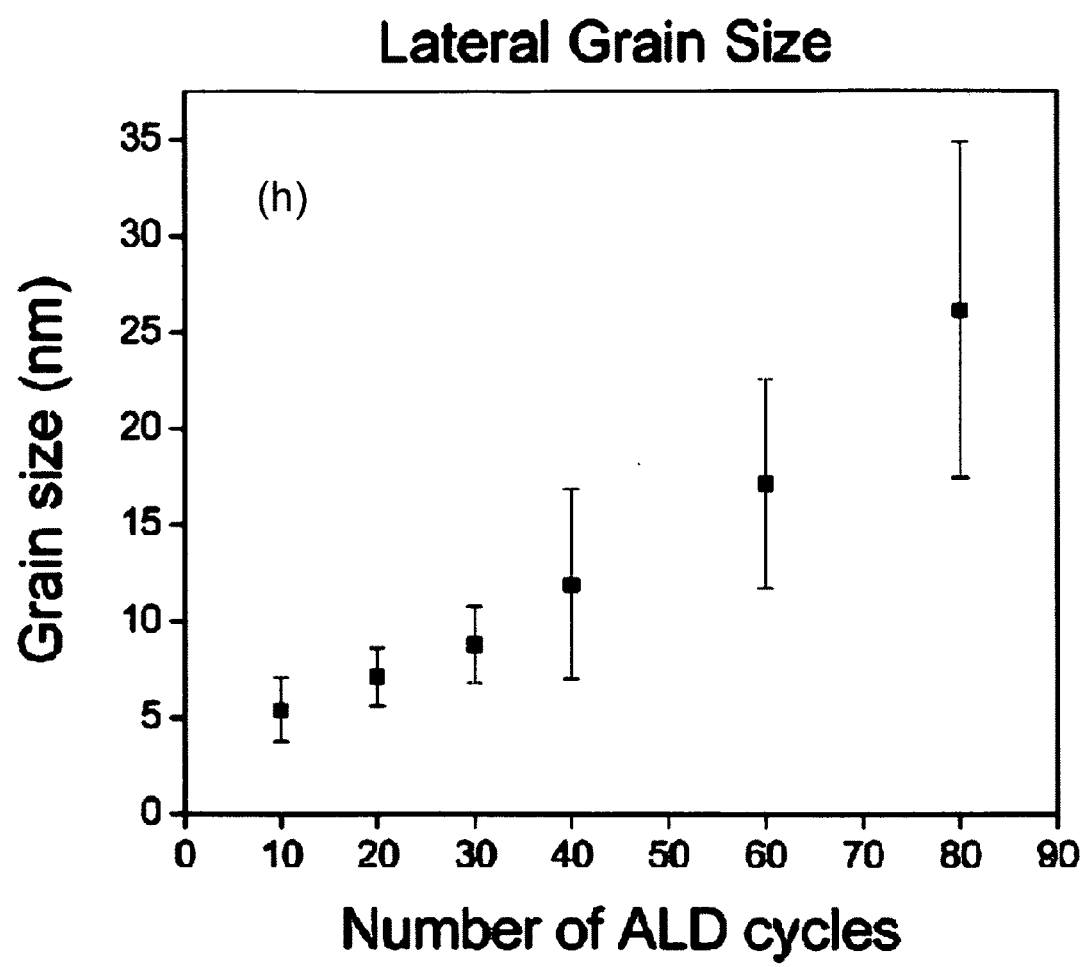

In this example, ALD PbS films were deposited with a varying number of cycles on $SiO_2$ membrane transmission electron microscopy (TEM) grids to study the nucleation and growth behavior of the films. The depositions were performed in a customized flow-type reactor designed for $H_2S$ compatibility. The precursors used were bis(2,2,6,6-tetramethyl-3,5-heptanedionato)lead(II) (Pb(tmhd)2), and a gas mixture of 3.5% $H_2S$ in $N_2$. The $Pb(tmhd)_2$ precursor was sublimated at 140° C. The substrate temperature during all ALD depositions was 160° C. Argon was used as a carrier gas with a flow rate of 10 sccm. Plane-view bright-field TEM images and in situ HRTEM video (10 frames/s) were taken by an FEI Tecnai G2 F20 X-TWIN operated at an accelerating voltage of 200 kV. Plane-view images were taken of the films after 10 to 80 ALD cycles. FIGS. 8.$a$1-8.$h$ show bright-field TEM images at low and high magnification of ALD PbS films deposited directly onto $SiO_2$ membrane TEM grids as a function of number of ALD cycles. FIG. 8$h$ shows a plot of grain size extracted from TEM images.

Several trends can be seen in the TEM images. The first observation is that polycrystalline PbS films initially nucleate as nanoscale crystallites on the $SiO_2$ surface. The initial crystallites formed have diameters below the Bohr exciton radius of PbS (~18 nm), enabling the depositing of PbS QDs in the early stages of ALD growth. The dimension of the crystallites normal to the surface is determined primarily by the number of ALD cycles, although the shape of the islands changes as crystallization occurs. These crystallites appear dark in the TEM images primarily through absorption contrast, as the density of PbS (7.61 g/cm$^3$) is significantly larger than that of $SiO_2$ (2.20 g/cm$^3$). The nucleation site size and density is seen to increase with the number of cycles. These nucleation sites then evolve into crystalline grains, which merge together to form a polycrystalline film. Additionally, the shape of the grain changes from roughly circular to rectangular with increasing cycle number, which is consistent with the formation of cubic, rock-salt crystallites when there is sufficient material present on the substrate. Selective area diffraction (SAD) patterns confirm that the grains are randomly oriented with the rock-salt structure. Because of the ability of ALD to conformally coat high-aspect-ratio gaps, it is likely that the images show crystallites that were deposited on both the front and backside of the grids. Therefore, the uncertainty in the apparent density of nucleation sites in these images is within a factor of 2.

To quantify the growth behavior of ALD PbS films, the average crystallite size is plotted in FIG. 8h. A square shape of grains is approximated, and the unit of grain size used is the average edge length of a square, based on the area of a dot. The standard deviation in crystallite size is seen to increase with cycle number, indicating that certain grain orientations may grow faster than others, and nucleation of new sites occurs along with grain growth.

To understand the initial formation of nucleation sites on the $SiO_2$ surface, several chemical phenomena should be considered. The first is the reactivity of the initial ALD cycle with the surface. The initial cycle includes a pulse of $Pb(tmhd)_2$, which has an energetically favorable reaction with —OH groups on the $SiO_2$ surface. This reaction can be described as

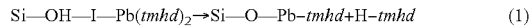

$$Si\text{—}OH\text{—}I\text{—}Pb(tmhd)_2 \rightarrow Si\text{—}O\text{—}Pb\text{-}tmhd + H\text{-}tmhd \quad (1)$$

This reaction can be limited by several factors, including the availability of reactive sites on the $SiO_2$ surface. Surface coverage of hydroxyl groups on $SiO_2$ is not 100% and decreases with increasing temperature above 100° C. Therefore, the reactivity of the substrate surface with the precursor will not be complete during the ALD reaction. Furthermore, there will be a steric hindrance that acts to prevent the formation of a complete monolayer per precursor pulse due to the relatively large size of the β-diketonate ligand, which will limit the spacing between chemisorbed Pb atoms during a saturated ALD pulse. Therefore, after the first precursor pulse, there will be a scattering of Pb atoms on the surface based on limited reactivity of the $SiO_2$ surface and the $Pb(tmhd)_2$ precursor.

During the subsequent $H_2S$ pulse, a second ligand-exchange reaction occurs, in which the remaining tmhd ligands on the surface are removed to the gas phase, and replaced with —SH groups bonded to the Pb atoms. This can be described as

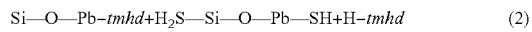

$$Si\text{—}O\text{—}Pb\text{-}tmhd + H_2S \text{—} Si\text{—}O\text{—}Pb\text{—}SH + H\text{-}tmhd \quad (2)$$

At this point, there will be pairs of Pb—S groups dispersed over the surface with a spacing defined by the separation of Pb atoms from the initial precursor pulse. Since this separation is significantly larger than the Pb—Pb separation in crystalline PbS, a crystalline phase is not formed during this initial AB reaction cycle.

After several ALD cycles, crystalline grains of PbS will form with the inter-atomic spacing defined by the lattice parameter. For a crystalline phase to form, some surface diffusion is likely to occur. This surface diffusion will involve breaking of chemical bonds and formation of new bonds based on the PbS crystal structure. One possibility is that this crystallization begins after the first AB reaction cycle, by diffusion of either individual atoms or Pb—S pairs. These atoms then bond with neighboring Pb—S pairs to form PbS clusters. These clusters can then act as nucleation sites for further growth of PbS crystallites, if the reactivity of ALD PbS with Pb—SH surface clusters is greater than with the substrate surface. Alternately, growth of randomly oriented grains may occur during subsequent cycles, and grains with preferential orientations may dominate the early stages of growth, leading to the formation of islands. Furthermore, owing to the relatively low temperatures of the ALD reaction, the rate of crystallization will likely be limited, suggesting the ability to further modify the film morphology by subsequent annealing.

Interestingly, electron-beam irradiation of the PbS crystallites in the TEM causes an evolution of the film morphology with exposure time. While the as-deposited crystallites quickly merge into grains with increasing ALD cycles, e-beam exposure leads to the formation of isolated nanoparticles with sub-10 nm diameters on the surface. The evolution of a PbS film deposited with 10 cycles is shown as a function of e-beam exposure time in a series of high-resolution (HR) TEM images in FIGS. 9.a1-9.a5. Here, the white arrows with solid circles show coalescence of smaller dots into larger dots, and the white arrows with dashed circles show sublimation of dots.

The irradiation effect on the PbS morphology may be due to localized specimen heating during e-beam exposure. There could be a large temperature increase due to absorption and inelastic scattering of electrons in the film and $SiO_2$ membrane, which is aided by limited heat transfer to the surroundings due to the low thermal conductivity of $SiO_2$. This substrate heating by e-beam irradiation has been previously observed by the inventors experimentally. To estimate the temperature of the substrate during e-beam exposure, the lattice parameter of a PbS nanoparticle was measured using in situ HRTEM as a function of irradiation time. The lattice parameter was observed to increase with irradiation time, suggesting that thermal expansion is occurring. By extrapolating reference data on the lattice parameter of PbS as a function of temperature, the nanocrystal temperature was estimated to increase from 300 to 850 K during an irradiation period of 180 s. Additionally, the electron beam could ionize the material and break chemical bonds, allowing for easier surface diffusion to occur.

Figure 9:
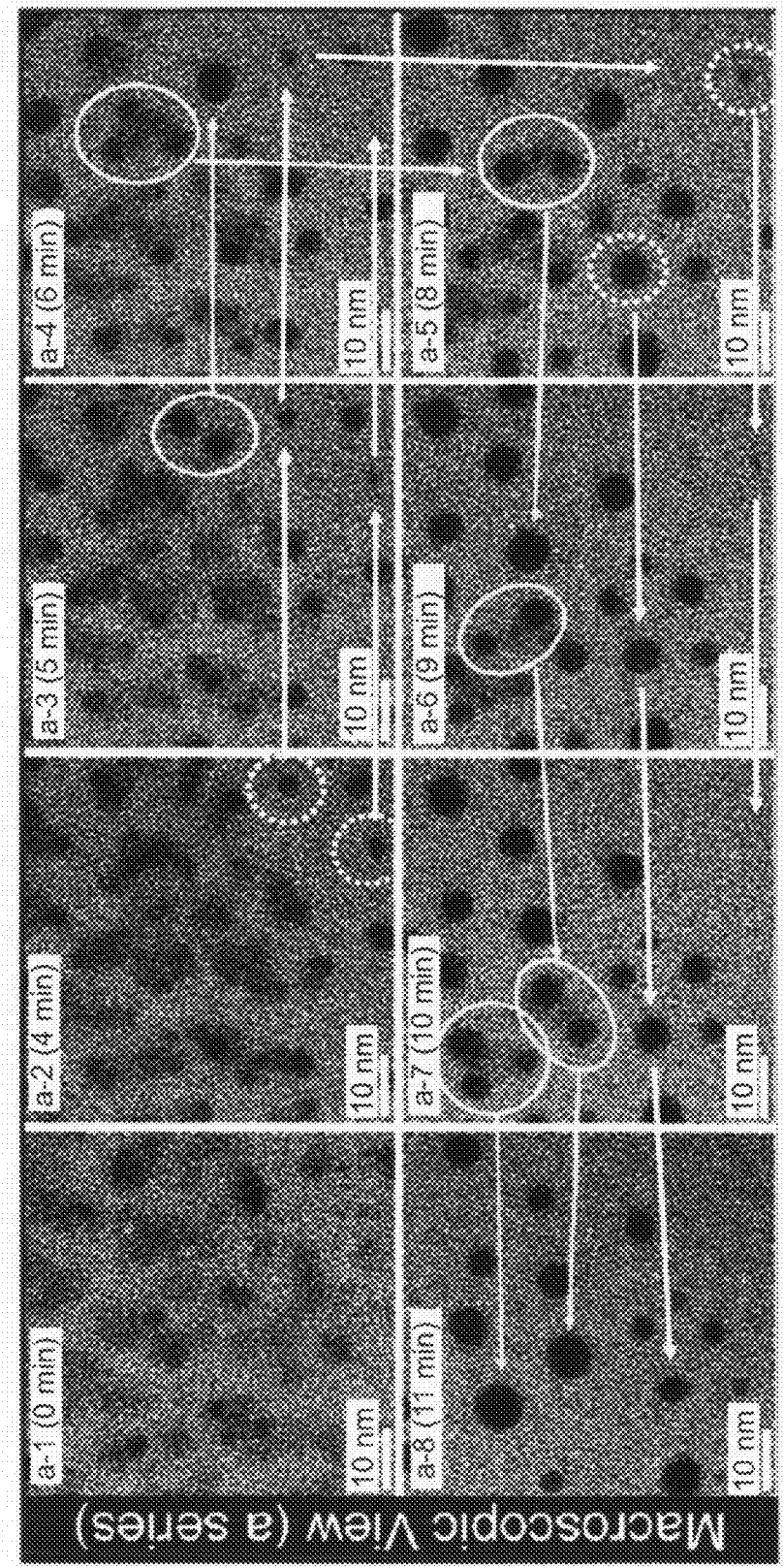
FIGS. 9.a1-9.a5 show evolution of an ALD PbS film during e-beam irradiation as a function of exposure time, according to one embodiment of the invention.
Figure 9:
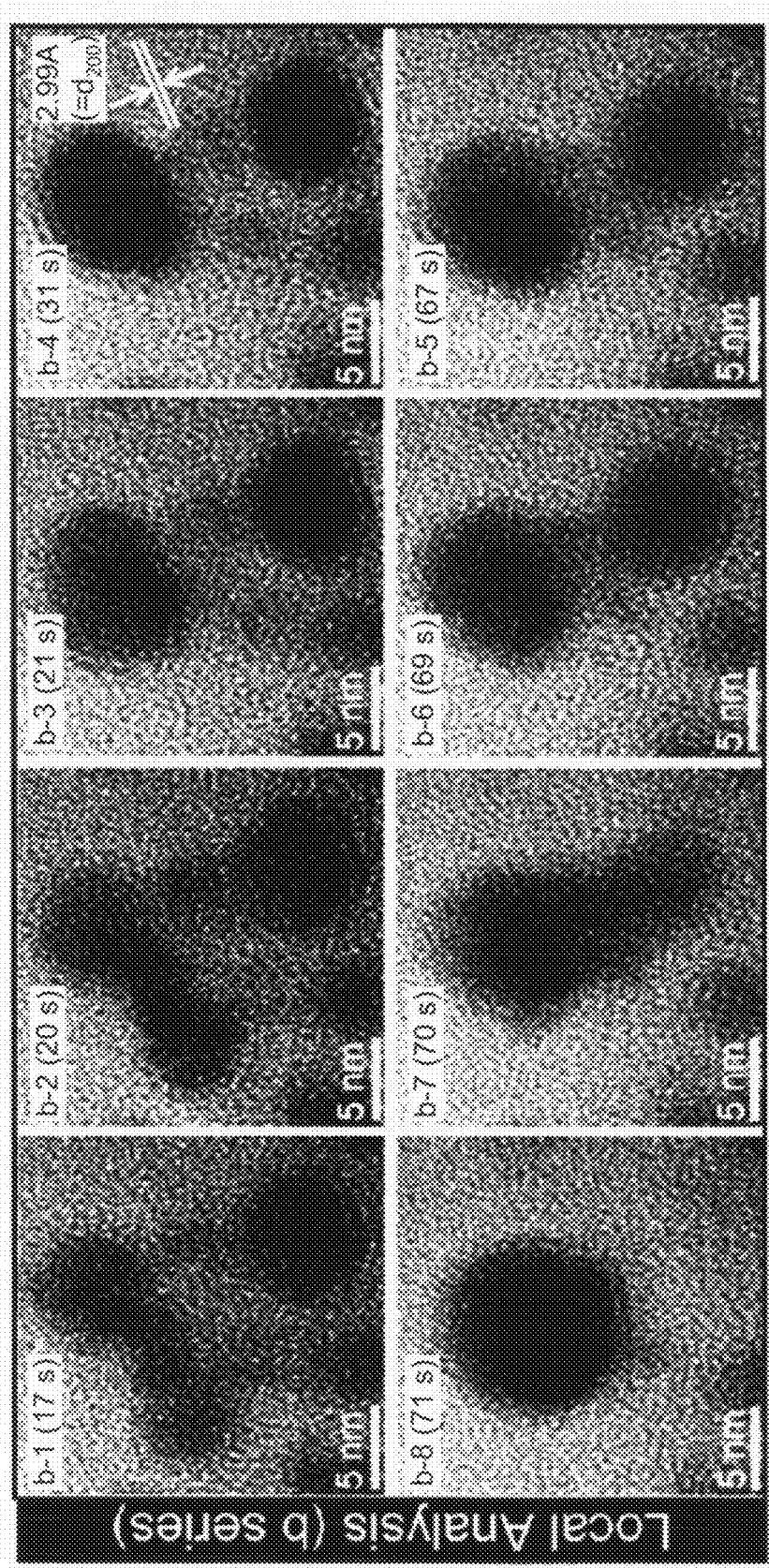

Coalescence of the PbS material into distinctive nanoparticles can be seen after exposure to around 10 min of e-beam irradiation as indicated in white arrows with solid circles in FIGS. 9.a1-9.a5. These nanoparticles have diameters within the strong confinement regime for PbS, indicating that they can behave as QDs. This coalescence of as-deposited PbS islands must be accompanied by surface diffusion, which has also been directly observed as migration of PbS crystallites on the surface during e-beam irradiation. This leads to an increase in the size of the nanoparticles due to the thermodynamic driving force toward obtaining a lower surface-to-volume ratio. This surface diffusion and coalescence behavior under e-beam irradiation has been observed in other systems, including gold nanoparticles.

Concurrently, sublimation and shrinkage of PbS nanoparticles after longer exposure times is indicated in white dashed circles in FIGS. 9.a1-9.a5. The TEM chamber pressure (8.8× $10^{-8}$ Torr) is likely to be lower than the pressure at the triple point of PbS, allowing for the film to sublime at a reduced temperature compared to higher pressure conditions. Furthermore, the melting or sublimation point of materials has been shown to decrease in particles with nanoscale dimensions. These two competing behaviors (enlargement by coalescence and shrinkage by sublimation) can be used to control particle size, since coalescence occurs at a much faster rate than sublimation; the average size of the QDs increases during shorter exposure times due to coalescence and shrinks with increasing time as sublimation begins to dominate. Furthermore, the standard deviation in particle size is seen to initially increase due to random coalescence and eventually decreases during sublimation (see Supporting Information). This suggests that annealing can be used to modify both the average particle size and reduce the variation in dot size as deposited by ALD.

Additionally, PbS nanoparticles experience a strong interaction during coalescence. While the driving force for an increase in particle diameter is thermodynamic, it is observed that neighboring nanoparticles tend to move directly toward each other, rather than experiencing random diffusion on the surface. Furthermore, their crystal orientation is synchronized with a bridge of aligned (200) planes between the particles. This is shown in a series of snapshots taken during an in situ HRTEM video in FIGS. 9.b1-9.b5. To facilitate this bridging behavior, atomic rearrangement was observed in the nanoparticles during irradiation, which has been previously observed during local heating of nanoparticles by an electron beam. As shown in FIGS. 9.b1-9.b5, in-situ observation of coalescence of two dots into one is presented. A bridge forms with aligned (200) planes between the dots.

Figure 10:
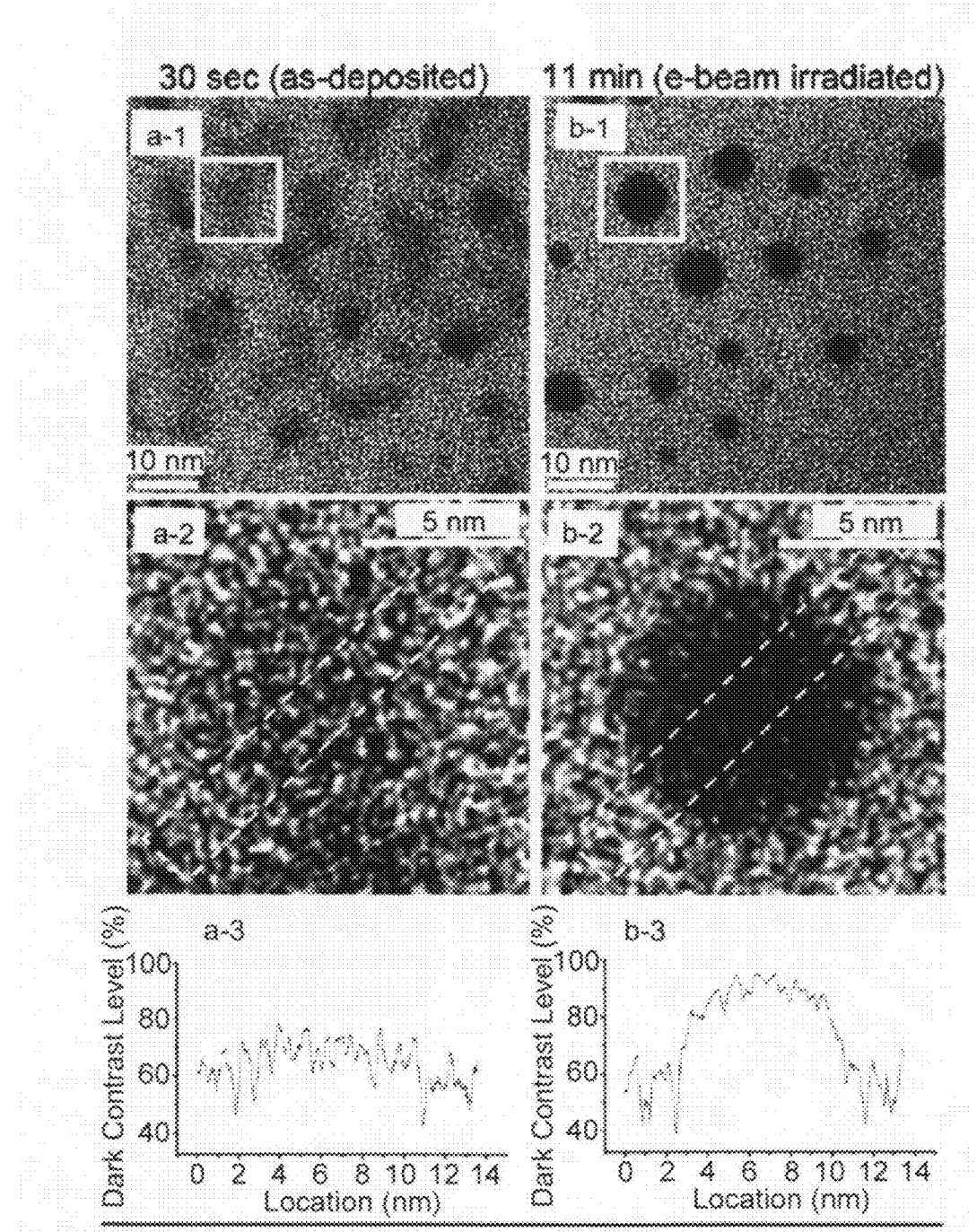
FIGS. 10.a1-10.b3 show the contrast of the nanoparticles is increased dramatically relative to the surroundings after 11 min of e-beam irradiation, according to one embodiment of the invention.

Another phenomenon that is observed during in-situ irradiation is a shape transformation from flat islands to more dome-shaped QDs. As-deposited crystallites during the ALD process provide low contrast in the TEM image, which is a result of a relatively flat "disk" shape. However, after irradiation, the contrast of the nanoparticles is increased dramatically relative to the surroundings. This is shown after 11 min of e-beam irradiation in FIGS. 10.a1-10.b2 by bright-field absorption contrast. As a result of the e-beam annealing process, the crystallite morphology changes to a dome shape to lower the surface to volume ratio, which is thermodynamically favorable due to the Gibbs-Thomson effect. This in turn provides more contrast in the TEM image due to a greater thickness variation between the center of the QD and the substrate. To quantify this shape transformation, average line profiles of dark contrast were measured before and after irradiation, as shown in FIGS. 10.a3 and 10.b3. The profiles show that the contrast is relatively flat across the dot before irradiation, while the slope of the profile increases dramatically after irradiation, which is in agreement with a dome-shaped thickness profile.

These results show a new method for fabrication of PbS QDs through the nucleation of crystallites during the initial stages of ALD growth. The size, shape, and density of QDs can be controlled by a number of variables, including number of cycles, reactivity between the precursor and substrate, and subsequent e-beam annealing. While e-beam irradiation in a TEM is not a practical large-scale manufacturing technique, it allows for the unique in situ observation of the evolution of the film morphology resulting from irradiation. It can also be used as a technique to precisely control the position or size of QDs in nanoscale experiments. This could in principle be replaced with other forms of annealing or irradiation, including larger scale photon, ion, or electron exposure.

Figure 11:
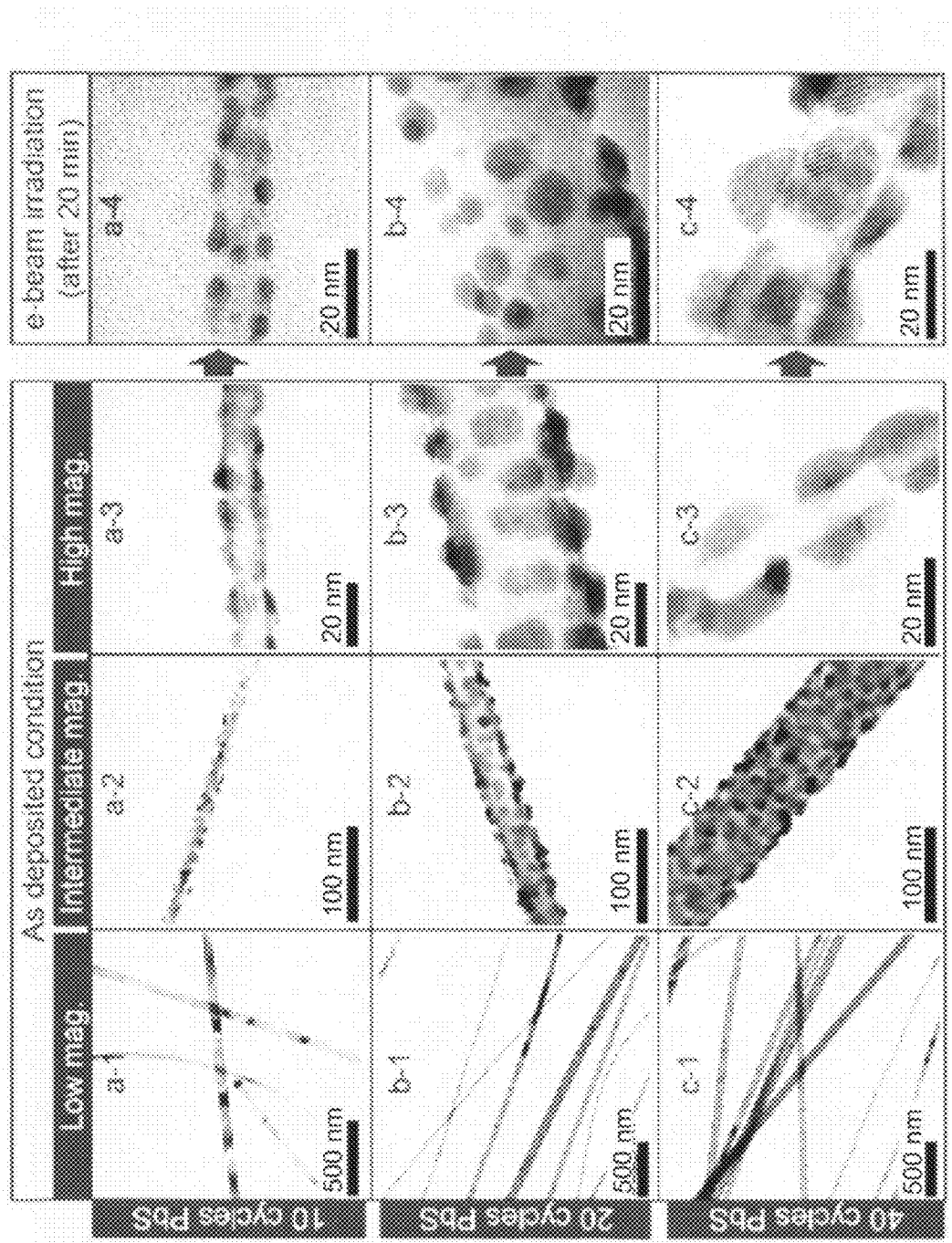
FIGS. 11.1a-11.c4 shows a series of TEM images of SiNWs coated by ALD PbS after various numbers of cycles, according to one embodiment of the invention.
Figure 12:
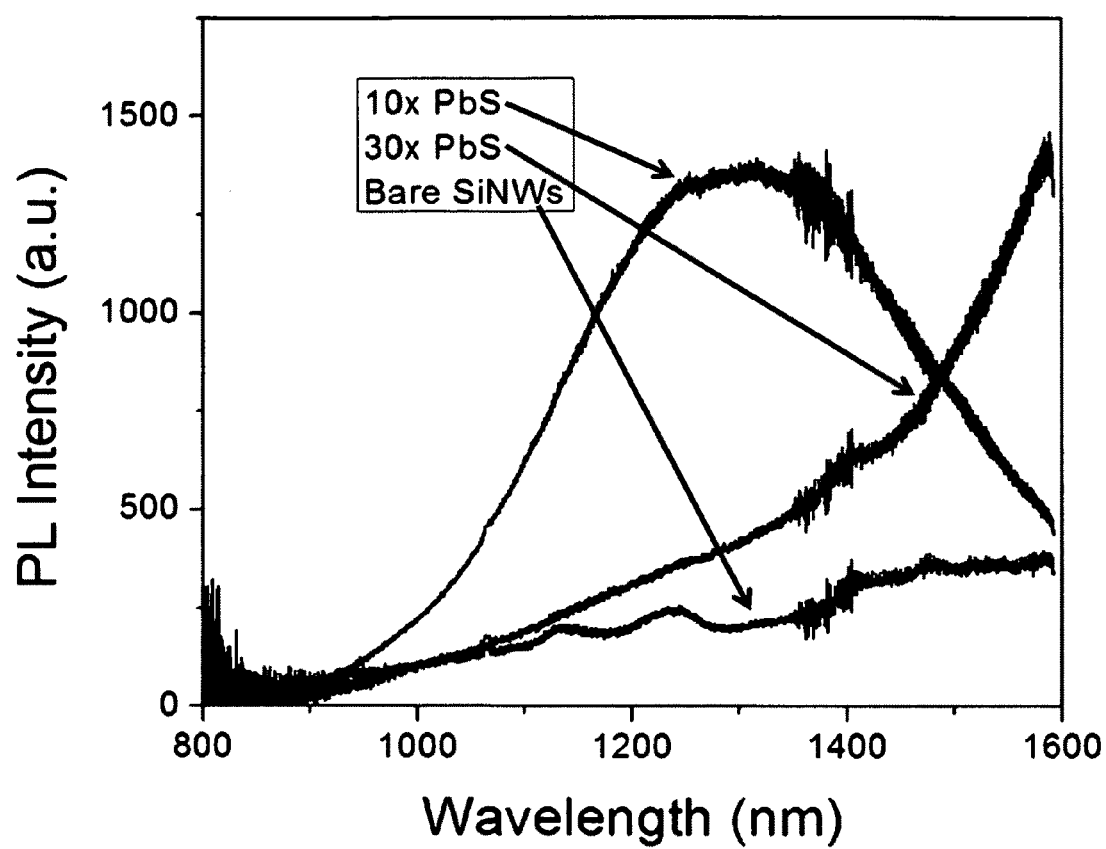
FIG. 12 shows Photoluminescence spectra for bare SiNWs, 10 cycle of ALD PbS, and 30 cycles of ALD PbS, according to one embodiment of the invention.

To demonstrate the real advantage of ALD for fabrication of QD arrays and the feasibility of coverage of high-aspect-ratio nanostructures with PbS QDs, ALD PbS was deposited on the surface of SiNWs grown by vapor-liquid-solid (VLS) growth. SiNWs were grown on silicon wafers and on stainless steel 304 mesh. For the silicon substrates, Au nanoparticle catalysts were deposited by functionalizing the substrates with 0.1% w/v aqueous poly-L-lysine solution and drop-casting the nanoparticles onto the substrates. For the stainless steel mesh, the catalyst consisted of a 25 nm Au film deposited by thermal evaporation. The substrates were preheated in a tube furnace at 490° C. for 10 min under vacuum after which a 50 sccm flow of silane (2% $SiH_4$ in Ar) was introduced for 12-15 min at 490° C. while the pressure of the system was maintained at 40 Torr. FIGS. 11.1a-11.4c shows a series of TEM images of SiNWs coated by ALD PbS after various numbers of cycles, which were transferred to a TEM grid for analysis. The TEM images of SiNWs coated by ALD PbS are shown at different magnifications after FIG. 11.a1-11.a4 10 cycles, FIG. 11.b1-11.b4 20 cycles, and FIG. 11.c1-11.c4 40 cycles. Also shown is the effect of 20 min e-beam irradiation on the dot-coated SiNWs. It can be seen that the nucleated PbS nanocrystals are uniformly distributed along the SiNWs over large aspect ratios. Additionally, the nanocrystal size and density can be controlled by the number of ALD cycles. It is difficult to accurately assess the absolute value of particle density due to the curved surface of the nanowires and the fact that QDs were observed on both sides of the nanowire in the TEM image. However, a trend of increased size and density with increasing cycle number is evident. The curved surface of the nanowire also distorts an interpretation of the exact size of the 3D dot, which is projected onto a 2D image. If the PbS acquires a curved dome shape to conform to the surface of the nanowire, the apparent thickness of the particles will increase in the 2D image. Interestingly, the as-deposited nanocrystals appear to be more isolated and dome-shaped on the nanowire surface than the plane-view samples would suggest. It is hypothesized that this is due to a higher surface diffusion rate on the nanowire surface compared to the flat $SiO_2$ TEM grid, allowing dots to approach their thermodynamically favorable shape at the deposition temperature. There could also be differences in the surface properties of the 40 nm thick $SiO_2$ grids and the thin native oxide on the SiNWs. The degree of this isolated dome-shaped geometry is shown to increase after 20 min of e-beam irradiation in FIG. 11.a4, 11.b4, and 11.c4, To demonstrate the ability to modify the optical properties of the nanowires from quantum confinement effects in ALD PbS QDs, photoluminescence (PL) measurements were performed on bare SiNWs grown on stainless steel mesh substrates, and compared to QD-coated nanowires. Absorption measurements were also performed using UV-vis spectrophotometry. However, the signal-to-noise ratio was much higher in the PL measurements due to the small level of absorption in the ultrathin films deposited in this example and the significantly higher sensitivity of the instrumentation for collecting PL. Continuous-wave optical excitation was provided by a frequency-doubled $Nd:VO_4$ laser at 532 nm, focused on the specimens with a 10× microscope objective to yield a pump intensity of ~50 kW/cm2. The PL was collected by the objective, passed through a 750 nm long-pass filter to reject the pump light, and focused onto the input slit of a spectrograph equipped with a liquid-nitrogen-cooled InGaAs photodiode array detector. Measurements were corrected for the spectral response of the system using a blackbody emitter at 3100 K. The samples were measured as-deposited by ALD without any annealing. The results are shown in FIG. 12.

The bare SiNWs demonstrate broadband near-infrared PL with relatively low intensity, which is typical of unannealed VLS-grown SiNWs, and are presumably due to a relatively large number of subgap defect states in the VLS-deposited material. On the other hand, after only 10 cycles of ALD PbS the PL intensity increases dramatically and has an approximately Gaussian distribution of wavelengths. This is consistent with an ensemble of QDs of different sizes, as seen in the TEM images. While this may be a disadvantage for applications such as lasers, where a single wavelength is desired, other applications such as solar cells may benefit from a broad distribution of wavelengths available for excitonic transitions. When the number of cycles was increased to 30, a clear shift in the PL distribution to longer wavelengths in the infrared can be seen, presumably due to the increased size of QDs. While the InGaAs detector used in these experiments cuts off at approximately 1600 nm in the IR, the trend of increased wavelength in emission is clearly demonstrated in these samples. This is indicative of quantum confinement in the PbS QDs, illustrating that their optical properties can be controlled simply by varying the number of ALD cycles.

The ability to conformally coat high-aspect ratio surfaces with a single layer of QDs whose size can be controlled by varying the number of deposition cycles is a unique and powerful ability. This suggests the possibility of developing a number of novel device architectures that benefit from the multitude of advantages of nanostructured materials, including improved absorption in QD solar cells. Additionally, this method could be applied to other applications, including sensors, LEDs, and photocatalysis.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed:

1. A method of fabricating quantum confinements, comprising:
   a. irradiating a substrate using an ion irradiation source, wherein said ion irradiation alters said substrate surface; and
   b. depositing using a deposition apparatus a material layer on said altered substrate surface during said irradiation or after said irradiation, wherein said material layer is deposited in at least two reactions that are based on a self-limiting surface chemistry of material constituents of said material layer, wherein said altered substrate surface promotes an altered deposition of said material layer, wherein said altered material layer comprises nucleation of quantum confinements within said altered material layer, wherein said self-limiting surface chemistry conformally deposits 3-D topologies distributed across said substrate surface.

2. The method of fabricating quantum confinements of claim 1, wherein said quantum confinements are selected from the group consisting of quantum wells, nanowires, nanotubes and quantum dots.

3. The method of fabricating quantum confinements of claim 1, wherein said irradiation is in-situ or ex-situ with respect to said deposition apparatus.

4. The method of fabricating quantum confinements of claim 1, wherein use of said irradiation is further disposed to affect i) a morphology, ii) a nucleation density, iii) a chemistry, i) and ii), i) and iii), ii) and iii), or i) and ii) and iii) of said material layer.

5. The method of fabricating quantum confinements of claim 1, wherein a bandgap of said material layer is adjusted by controlling the size of the quantum confinement dimensions.

6. The method of fabricating quantum confinements of claim 1, wherein a bandgap of said material layer is adjusted by controlling the material properties surrounding the quantum confinements.

7. The method of fabricating quantum confinements of claim 1, wherein template-assisted growth is used to form said quantum confinements.

8. The method of fabricating quantum confinements of claim 7, wherein said template-assisted growth comprises using anodized aluminum oxide (AAO), or track-etched polycarbonate membranes, wherein said quantum confinements comprise quantum dots, nanowires or nanotubes.

9. The method of fabricating quantum confinements of claim 1, wherein said deposition comprises atomic layer deposition, wherein said quantum confinements comprise quantum dots, wherein a nucleation of said quantum dots are controlled by controlling ALD deposition conditions selected from the group consisting of precursors, reactor temperatures, substrate materials, reactor pressures, ambient gases, precursor pulse time and reaction time.

10. The method of fabricating quantum confinements of claim 1, wherein from said irradiation during said deposition, chemical reactions on the surface of said material layer are induced using ambient gases, wherein said ambient gas comprises an oxidizing or reducing species, wherein when said oxidizing or reducing species is exposed to said irradiated surface to promote chemical reactions on the surface of said substrate layer, wherein nucleation of said quantum confinements are affected by breaking chemical bonds of said material layer by said irradiation, forming said chemical bonds of said material layer by said irradiation, or influencing the stoichiometry of said material layer by said irradiation.

11. The method of fabricating quantum confinements of claim 1, wherein from said irradiation prior to said deposition, said irradiation is disposed to cause chemical changes in said substrate layer comprising a breaking of chemical bonds of said material layer, wherein a formation of new morphologies on the surface of said material layer is provided.

12. The method of fabricating quantum confinements of claim 1, wherein said ion irradiation is disposed to create static electric charges on a surface of said substrate layer.

13. The method of fabricating quantum confinements of claim 1, wherein said ion irradiation is disposed to roughen the surface morphology of said substrate layer, wherein said rough surface morphology controls a nucleation behavior of said quantum confinements by creating preferential sites for nucleation and controlling surface diffusion processes.

14. The method of fabricating quantum confinements of claim 1, wherein said ion irradiation is used transfer kinetic energy to said material layer, wherein said ion irradiation is used to modify the morphology of said substrate, create static charges on the surface of said material layer surface, wherein the nucleation size and density of said quantum confinements in said material layer are controlled.

15. The method of fabricating quantum confinements of claim 1, wherein said ion irradiation is used to control electrostatic interactions between material being deposited and said substrate, wherein said interactions modify the morphology of said substrate or create static charges on the surface material layer surface, wherein the nucleation size and density of said quantum confinements are controlled.

16. A method of fabricating quantum confinements, comprising:
   a. introducing a substrate surface to a deposition apparatus; and
   b. depositing using said deposition apparatus a material layer on said substrate surface during or after irradiation with electrons, wherein said material layer is deposited in at least two reactions that are based on a self-limiting surface chemistry of material constituents of said material layer, wherein said irradiation promotes an altered deposition of said material layer, wherein said material layer comprises nucleation of quantum confinements within said material layer, wherein said self-limiting surface chemistry conformally deposits 3-D topologies distributed across said substrate surface.

17. The method of fabricating quantum confinements of claim 16, wherein said quantum confinements are selected from the group consisting of quantum wells, nanowires, nanotubes and quantum dots.

18. The method of fabricating quantum confinements of claim 16, wherein said irradiation is in-situ or ex-situ with respect to said deposition apparatus.

19. The method of fabricating quantum confinements of claim 16, wherein use of said irradiation is further disposed to affect i) a morphology, ii) a nucleation density, iii) a chemistry, i) and ii), i) and iii), ii) and iii), or i) and ii) and iii) of said material layer.

20. The method of fabricating quantum confinements of claim 16, wherein a bandgap of said material layer is adjusted by controlling the size of the quantum confinement dimensions.

21. The method of fabricating quantum confinements of claim 16, wherein a bandgap of said material layer is adjusted by controlling the material properties surrounding the quantum confinements.

22. The method of fabricating quantum confinements of claim 16, wherein template-assisted growth is used to form said quantum confinements.

23. The method of fabricating quantum confinements of claim 22, wherein said template-assisted growth comprises using anodized aluminum oxide (AAO), or track-etched polycarbonate membranes, wherein said quantum confinements comprise quantum dots, nanowires or nanotubes.

24. The method of fabricating quantum confinements of claim 16, wherein said deposition comprises atomic layer deposition.

25. The method of fabricating quantum confinements of claim 16, wherein said quantum confinements comprise quantum dots, wherein a nucleation of said quantum dots are controlled by controlling ALD deposition conditions selected from the group consisting of precursors, reactor temperatures, substrate materials, reactor pressures, ambient gases, precursor pulse time and reaction time.

26. The method of fabricating quantum confinements of claim 16, wherein from said irradiation during said deposition, chemical reactions on the surface of said material layer are induced using ambient gases simultaneous with said irradiation, wherein said ambient gas comprises an oxidizing or reducing species, wherein said oxidizing or reducing species is exposed to said irradiation to promote chemical reactions on the surface of said substrate layer, wherein nucleation of said quantum confinements are affected by breaking chemical bonds of said material layer and/or said material consittuents by said irradiation, forming said chemical bonds of said material layer by said irradiation, or influencing the stoichiometry of said material layer by said irradiation.

27. The method of fabricating quantum confinements of claim 16, wherein from said irradiation prior to said deposition, said irradiation is disposed to cause chemical changes in said substrate layer comprising a breaking of chemical bonds of said material constituents, wherein a formation of new morphologies on the surface of said material layer is provided.

28. The method of fabricating quantum confinements of claim 16, wherein said irradiation is disposed to create static electric charges on a surface of said substrate layer.

29. The method of fabricating quantum confinements of claim 16, wherein said ion irradiation is used transfer kinetic energy to said material constituents, or wherein said irradiation is used to create static charges on the surface of said material layer surface, wherein the nucleation size and density of said quantum confinements in said material layer are controlled.

30. The method of fabricating quantum confinements of claim 16, wherein said irradiation is used to control electrostatic interactions between material being deposited and said substrate, wherein said interactions modify the morphology of said substrate or create static charges on the surface material layer surface, wherein the nucleation size and density of said quantum confinements are controlled.

31. A method of fabricating quantum confinements, comprising:
   a. introducing a substrate surface to a deposition apparatus; and
   b. depositing using said deposition apparatus a material layer on said substrate surface during or after irradiation with photons, wherein said material layer is deposited in two at least two reactions that are based on a self-limiting surface chemistry of material constituents of said material layer, wherein said irradiation promotes an altered deposition of said material layer, wherein said material layer comprises nucleation of quantum confinements within said material layer, wherein said self-limiting surface chemistry conformally deposits 3-D topologies distributed across said substrate surface.

32. The method of fabricating quantum confinements of claim 31, wherein said quantum confinements are selected from the group consisting of quantum wells, nanowires, nanotubes and quantum dots.

33. The method of fabricating quantum confinements of claim 31, wherein said irradiation is in-situ or ex-situ with respect to said deposition apparatus.

34. The method of fabricating quantum confinements of claim 31, wherein use of said irradiation is further disposed to affect i) a morphology, ii) a nucleation density, iii) a chemistry, i) and ii), i) and iii), ii) and iii), or i) and ii) and iii) of said material layer.

35. The method of fabricating quantum confinements of claim 31, wherein a bandgap of said material layer is adjusted by controlling the size of the quantum confinement dimensions.

36. The method of fabricating quantum confinements of claim 31, wherein a bandgap of said material layer is adjusted by controlling the material properties surrounding the quantum confinements.

37. The method of fabricating quantum confinements of claim 31, wherein said deposition comprises atomic layer deposition.

38. The method of fabricating quantum confinements of claim 31, wherein said quantum confinements comprise quantum dots, wherein a nucleation of said quantum dots are controlled by controlling ALD deposition conditions selected from the group consisting of precursors, reactor temperatures, substrate materials, reactor pressures, ambient gases, precursor pulse time and reaction time.

39. The method of fabricating quantum confinements of claim 31, wherein from said irradiation during said deposition, chemical reactions on the surface of said material layer are induced using ambient gases simultaneous with said irradiation, wherein said ambient gas comprises an oxidizing or reducing species, wherein said oxidizing or reducing species is exposed to said irradiation to promote chemical reactions on the surface of said substrate layer, wherein nucleation of said quantum confinements are affected by breaking chemical bonds of said material layer and/or said material consittuents by said irradiation, forming said chemical bonds of said material layer by said irradiation, or influencing the stoichiometry of said material layer by said irradiation.

40. The method of fabricating quantum confinements of claim 31, wherein from said irradiation prior to said deposition, said irradiation is disposed to cause chemical changes in said substrate layer comprising a breaking of chemical bonds of said material consituents, wherein a formation of new morphologies on the surface of said material layer is provided.

41. The method of fabricating quantum confinements of claim 31, wherein said ion irradiation is used transfer kinetic energy to said material constituents, wherein the nucleation size and density of said quantum confinements in said material layer are controlled.

* * * * *